United States Patent [19]

Van De Walle et al.

[11] Patent Number: 5,731,747

[45] Date of Patent: Mar. 24, 1998

[54] ELECTRONIC COMPONENT HAVING A THIN-FILM STRUCTURE WITH PASSIVE ELEMENTS

[75] Inventors: Gerjan F. A. Van De Walle; Edward W. A. Young, both of Eindhoven, Netherlands

[73] Assignee: U.S. Philips Corporation, New York, N.Y.

[21] Appl. No.: 606,324

[22] Filed: Feb. 23, 1996

[30] Foreign Application Priority Data

Feb. 27, 1995 [EP] European Pat. Off. .......... 95200477

[51] Int. Cl.$^6$ .................................................. H03H 7/06
[52] U.S. Cl. .................... 333/172; 361/306.3; 338/216
[58] Field of Search .................... 333/172; 361/301.4, 361/306.3; 338/64, 216, 309

[56] References Cited

U.S. PATENT DOCUMENTS

| | | | |
|---|---|---|---|
| 3,569,872 | 3/1971 | Berlin | 333/172 |
| 3,868,587 | 2/1975 | Nathan et al. | 333/172 X |
| 4,302,737 | 11/1981 | Kausche et al. | 333/172 |
| 4,342,143 | 8/1982 | Jennings | 29/25.42 |
| 4,410,867 | 10/1983 | Arcidiacomo et al. | 333/172 |
| 4,560,963 | 12/1985 | Sharpe | 333/172 |

OTHER PUBLICATIONS

Ohr, "Circular Design Improves Trim Factors of Thick-Film Resistors", *Electronics Design 3*, vol. 28, Feb. 1, 1980, p. 33.

"A Silicon-on-Silicon Multichip Module Technology with Integrated Bipolar Components in the Substrate", by Ray-Long Day et al, Proc. 1994 IEEE MCM Conference, MCMC-94, pp. 64-67. no month.

*Primary Examiner*—Robert Pascal
*Assistant Examiner*—Justin P. Bettendorf
*Attorney, Agent, or Firm*—Steven R. Biren

[57] ABSTRACT

An electronic component with a substrate (1, 31) of which a surface (4, 34) is provided with a thin-film structure with passive elements (5, 35), with a resistor (6, 36) formed in a layer of resistor material (7, 37), and with a capacitor having a lower electrode (9, 39) formed in an electrode layer (10, 40) provided on the surface, a dielectric (11, 41) formed by a layer of insulating material (12, 41) provided on the lower electrode, and an upper electrode (13, 43) formed in an electrode layer (14, 44) provided on the dielectric. One of the electrodes (9, 43) of the capacitor (8, 38) is formed in an electrode layer (10, 44) which is constructed as a dual layer (19-21, 49-51), of which the layer of resistor material (7, 37) in which also the resistor (6, 36) is formed constitutes a first partial layer (19, 49), on which a layer of conductive material (20, 55) is provided which constitutes the other, second partial layer (21, 51). The capacitor has a comparatively low series resistance owing to the use of the dual layer.

10 Claims, 4 Drawing Sheets

ELECTRONIC COMPONENT HAVING A THIN-FILM STRUCTURE WITH PASSIVE ELEMENTS

BACKGROUND OF THE INVENTION

The invention relates to an electronic component with a substrate of which a surface is provided with a thin-film structure with passive components, with a resistor formed in a layer of resistor material and a capacitor having a lower electrode formed in an electrode layer provided on the surface, a dielectric formed by a layer of insulating material provided on the lower electrode, and an upper electrode formed in an electrode layer provided on the dielectric.

Processes may be used in the manufacture of such an electronic component which are also used in the manufacture of semiconductor devices such as integrated circuits. The passive elements may then be provided on a substrate with dimensions of a few microns. When a silicon wafer is used as the substrate, for example provided with a silicon oxide layer, it is possible to provide besides the passive elements also active elements such as bipolar and MOS transistors in the electronic component. RC and LC networks may be included in an envelope such as is used for enveloping integrated circuits; whether or not in combination with active components.

R. Day et al., "A Silicon-on-Silicon Multichip Module Technology with Integrated Bipolar Components in the Substrate", Proc. 1994 IEEE MCM Conference, MCMC-94, pp. 64–67, discloses a component of the kind mentioned in the opening paragraph where the lower electrode of the capacitor is formed in the same layer of resistor material in which also the resistor is formed. The resistor material used is tantalum silicide here. The resistor and the lower electrode are covered with an insulating silicon nitride layer which at the same time forms the capacitor dielectric. The upper electrode of the capacitor is formed in an electrode layer of aluminium. In this aluminium electrode layer, conductor tracks are also formed which are connected to the resistor and to the lower electrode of the capacitor.

The thin-film structure with the resistor and the capacitor in the known component can be manufactured comparatively simply. A limited number of process steps and three photoresist masks are necessary for this. One mask for forming the lower electrode and the resistor in the layer of resistor material, one mask for providing the insulating silicon nitride layer with contact windows, and one mask for forming the upper electrode in the aluminium electrode layer.

A disadvantage of the known component, however, is that the lower electrode is manufactured from a resistor material. As a result, the capacitor has a comparatively great series resistance. In addition, the lower electrode is contacted by the conductor track next to the upper electrode, so laterally of the actual capacitor. This further increases said series resistance.

SUMMARY OF THE INVENTION

The invention has for its object inter alia to provide a component with a thin-film structure with the resistor and capacitor of the kind mentioned in the opening paragraph which can also be manufactured comparatively simply, but where the capacitor has a comparatively low series resistance.

According to the invention, the electronic component is for this purpose characterized in that one of the electrodes of the capacitor is formed in an electrode layer which is constructed as a dual layer of which a first partial layer is formed by the layer of resistor material in which also the resistor is formed, while a layer of conductive material is provided thereon which forms the other, second partial layer.

The capacitor in the component according to the invention also has a series resistance. Since the electrode is formed in a dual layer, the series resistance can be subdivided into a series resistance present in the partial layer of resistor material and a series resistance present in the partial layer of conductive material. The former series resistance is comparatively high, the latter comparatively low. Since the two are parallel, the total series resistance is also comparatively low.

The electronic component according to the invention may also be manufactured in a simple manner. After the dual layer has been provided, the electrode and the resistor are formed in both partial layers by means of a first photoresist mask, after which the first partial layer is removed from the resistor by means of a second photoresist mask. One photoresist mask is necessary for providing contact windows in the dielectric layer, and one for forming conductor tracks in the other electrode layer. A total of four photoresist masks is required.

One of the electrodes of the capacitor is formed in the electrode layer which is constructed as a dual layer, while preferably the other electrode of the capacitor is formed in an electrode layer which is constructed as a single layer of conductive material. Well-conducting conductor tracks are formed in both electrode layers in the element according to the invention. With the four photoresist masks mentioned above, accordingly, two wiring layers can be made in addition to the thin-film structure with capacitor and resistor.

In the known component, well-conducting conductor tracks can be formed in the conductive electrode layer only. For forming a second wiring layer, therefore, another insulating layer and an additional pattern of aluminium conductors is formed on top of the thin-film structure comprising the resistor and capacitor. Extra process steps and two more photoresist masks are necessary for providing this extra pattern of conductors. One of the extra photoresist masks for providing the insulating layer with contact windows, the other one for forming the conductor tracks in an aluminium layer.

The electrode layer constructed as a dual layer may be provided either above or below the electrode layer constructed as a single layer of conductive material. Preferably, the electrode layer constructed as a single layer of conductive material is provided on the substrate surface, and the electrode layer constructed as a dual layer is provided on the layer of insulating material which forms the capacitor dielectric. The resistor formed in the dual layer through local removal of the conductive layer therefrom then lies exposed at the surface of the thin-film structure. The resistor may thus be trimmed in a simple manner: its resistance value may be simply changed through local removal of the resistor material.

The capacitance value of the capacitor may also be readily changed because the upper electrode lies exposed at the surface of the thin-film structure. In a particular embodiment of the component according to the invention, a coil is also formed in the electrode layer constructed as a dual layer, one coil end being connected to a conductor track formed in the electrode layer provided on the surface. The self-inductance value of this coil may be readily changed in a corresponding manner because it lies exposed at the surface of the thin-film structure.

Preferably, a trimming surface is formed in the resistor layer at the area of the resistor, by means of which the resistance value is changed through removal of said trimming surface, while trimming surfaces are formed in the dual layer at the areas of the capacitor and of the coil, by means of which the capacitance or self-inductance values are changed through removal of said trimming surfaces. Such trimming surfaces may be so provided that the resistance, capacitance, or self-inductance values can be changed to known, predetermined values.

Preferably, furthermore, the layer of conductive material is removed from the layer of resistor material at the areas of the trimming surfaces for the capacitor and the coil. Trimming surfaces of the same material are then to be removed for trimming of all these passive elements mentioned.

BRIEF DESCRIPTION OF THE DRAWINGS

The invention will be explained in more detail below by way of example with reference to the drawings, in which.

DESCRIPTION OF THE PREFERRED EMBODIMENTS

Figure 1:
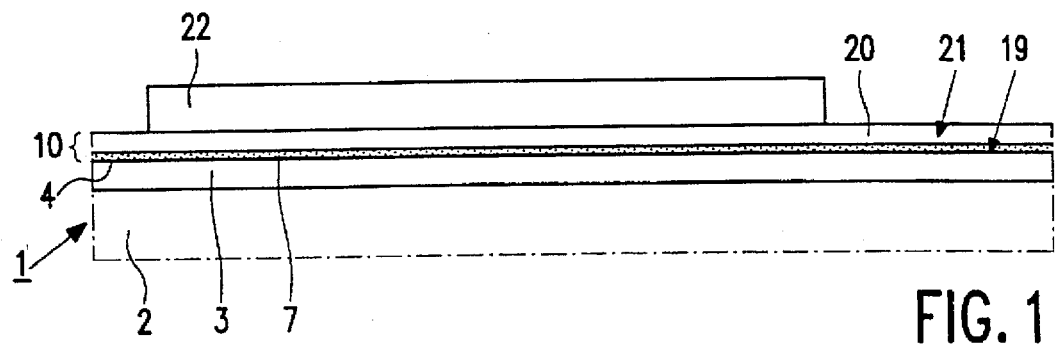
FIGS. 1, 2, 3, 4 and 5 diagrammatically and in cross-section show several stages in the manufacture of an electronic component according to the invention.
Figure 2:
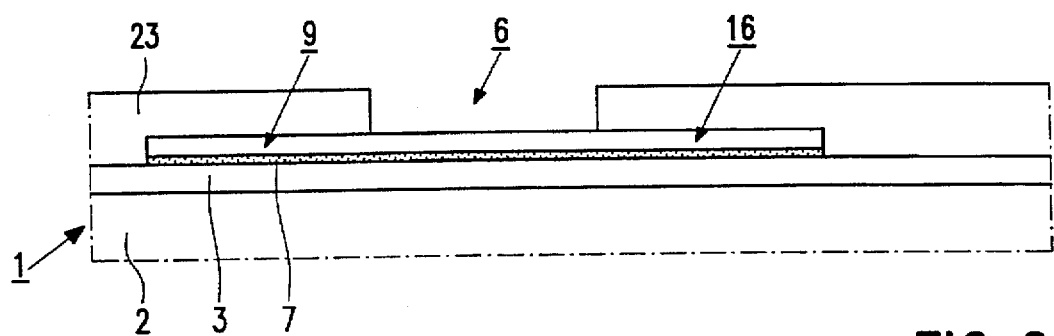
Figure 3:
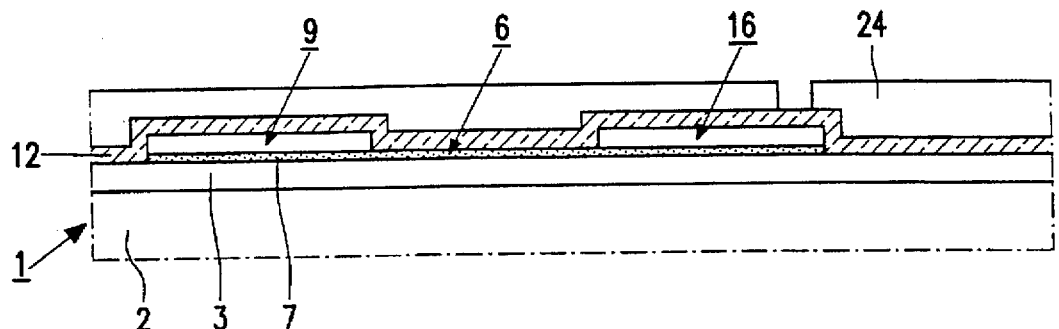
Figure 4:
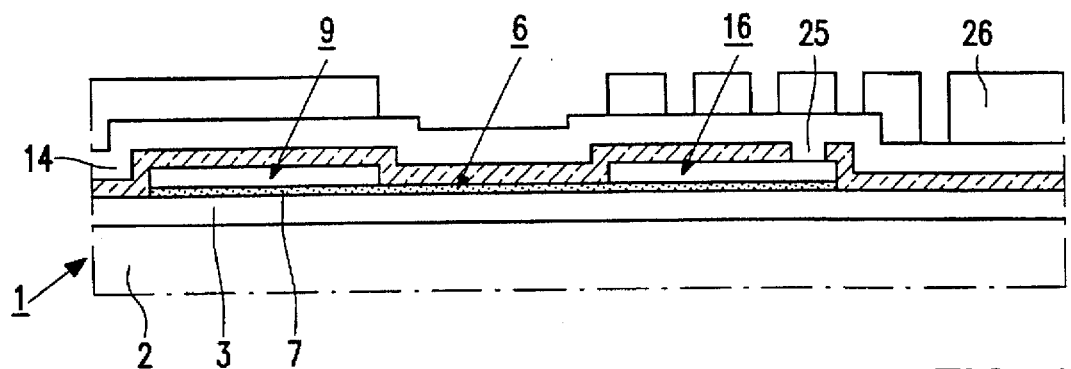
Figure 5:
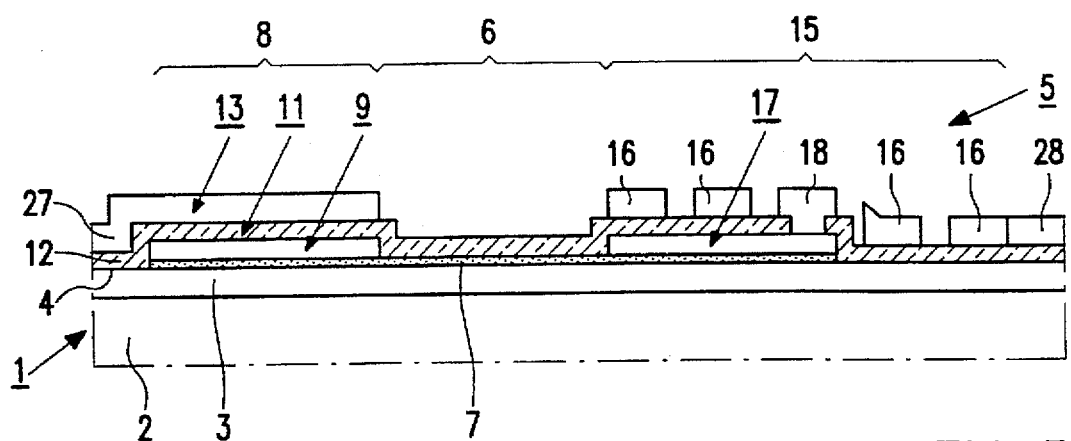
Figure 6:
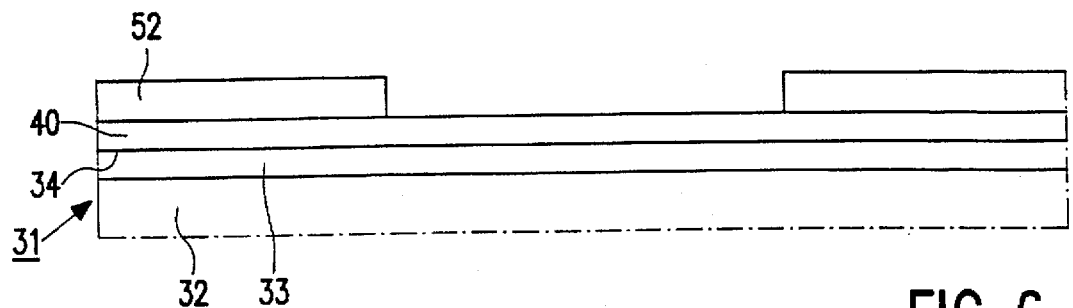
FIGS. 6, 7, 8, 9 and 10 diagrammatically and in cross-section show several stages in the manufacture of a preferred embodiment of an electronic component according to the invention.
Figure 7:
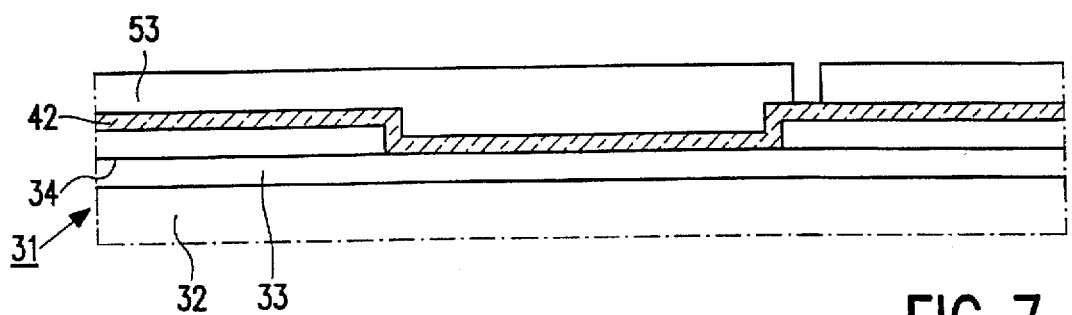
Figure 8:
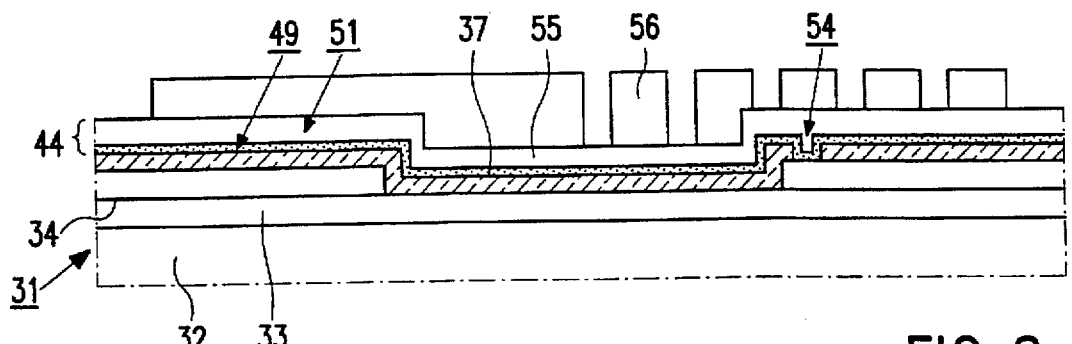
Figure 9:
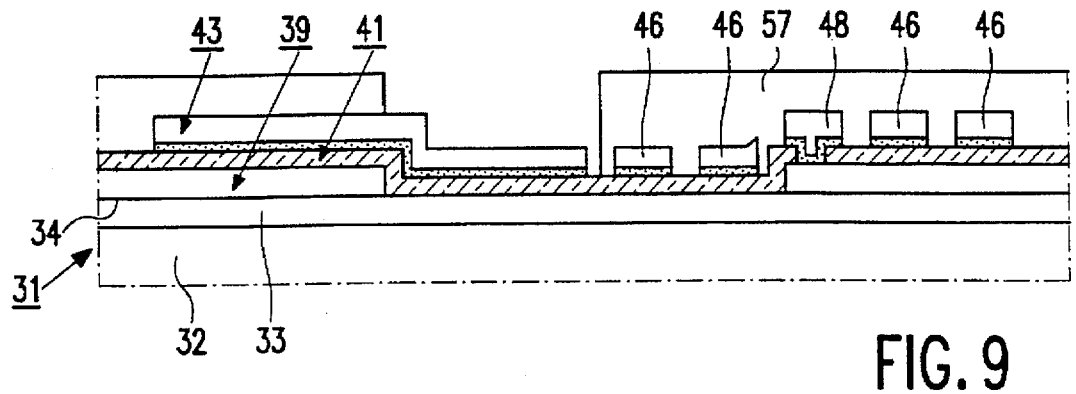

FIGS. 1 to 4 diagrammatically and in cross-section show several stages in the manufacture of an electronic component, the component shown in FIG. 5, with a substrate 1, a silicon wafer 2 in this example provided with a silicon oxide layer 3. A surface 4 of the substrate is provided with a thin-film structure with passive elements 5. The structure 5 comprises a resistor 6 formed in a layer of resistor material 7, and a capacitor 8 with a lower electrode 9 formed in an electrode layer 10 provided on the surface 4, with a dielectric 11 formed by a layer of insulating material 12 provided on the lower electrode 9, and with an upper electrode 13 formed in an electrode layer 14 provided on the dielectric 11. The thin-film structure 5 also comprises a coil, 15 with turns 16 formed in the electrode layer 14 provided on the insulating layer 12. An end 18 of the coil 15 is connected to the resistor 6 by means of a conductor track 17 formed in the electrode layer 10 present on the surface 4.

According to the invention, one of the electrodes of the capacitor 8, in this example the lower electrode 9, is formed in an electrode layer 10 which is constructed as a dual layer of which the flyer of resistor material 7, in which also the resistor 6 is formed, constitutes a first partial layer 19, on which a layer of conductive material 20 is provided which constitutes the other, second partial layer 21.

The capacitor 8 has a series resistance. Since the electrode 9 is formed in the dual layer 10, the series resistance can be subdivided into a series resistance present in the partial layer 19 of resistor material and a series resistance present in the partial layer 21 of conductive material. The former series resistance is comparatively high, the latter comparatively low. Since the two are parallel, the total series resistance is also comparatively low.

The electronic component shown in FIG. 5 may be manufactured in a simple manner. First a layer of resistor material 7 and a layer of conductive material 20 is deposited on the surface 4 of the substrate 1 in a usual sputtering process without the substrate 1 being taken from the sputtering machine. The layer of resistor material 7 in this example is an approximately 100 nm thick TiW layer which has a square resistance of approximately 10Ω. The layer of conductive material 20 in this example is an approximately 500 nm thick aluminium layer which has a square resistance of less than 0.1Ω.

After the application of the dual layer 19, 21, the electrode 9, the resistor 6, and the conductor track 17 are formed in the two partial layers 19, 21 in usual manner by means of a first photoresist mask 22. Then the first partial layer 21 is removed from the resistor 6 by means of a second photoresist mask 23.

Subsequently, the layer of insulating material 12 is deposited. In the present example this is an approximately 100 nm thick silicon nitride layer which is deposited in a usual PECVD (Plasma Enhanced Chemical Vapour Deposition) process. Contact windows 25 are etched into this layer of insulating material by means of a third photoresist mask 24 in a usual etching plasma comprising fluorine.

After the contact window 25 has been formed, the electrode layer 14 is deposited on the layer of insulating material 12. In this example, an approximately 500 nm thick aluminium layer is deposited by means of a usual sputtering deposition process. The upper electrode of the capacitor 8 and the turns 16 of the coil 15 are formed in this layer by means of a fourth photoresist mask 26.

One of the electrodes, here the lower electrode 9 of the capacitor 8, is formed in the electrode layer 10 which is constructed as a dual layer, the other electrode 13 in an electrode layer 14 which is constructed as a single layer of conductive material. Well-conducting conductor tracks 17 and 27, 28 are formed in the two electrode layers 10 and 14, respectively, of the element according to the invention. The conductor track 16 connects the end 18 of the coil 15 to the resistor 6, the conductor track 27 connects the capacitor 8, and the conductor track 28 connects the coil 15 to, for example, another passive element which is not shown. With the four photoresist masks mentioned above, accordingly, two wiring layers 17 and 27, 28 are formed in addition to the thin-film structure 5 with the capacitor 8 and the resistor 16.

Figure 10:
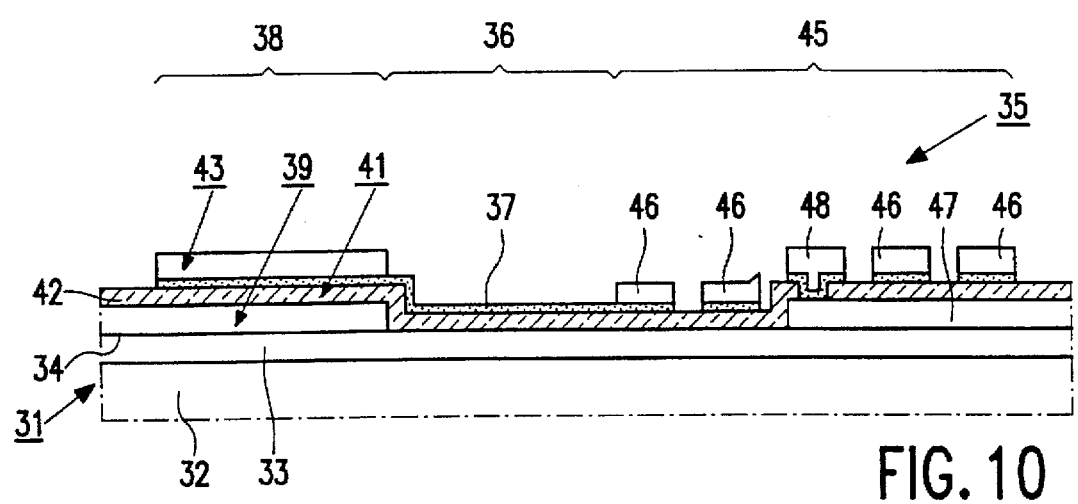

In the component,shown in FIG. 5, the electrode layer 10 constructed as a dual layer 19, 21 is provided below the other electrode layer 13. FIG. 10 shows a preferred embodiment of an electronic component. This comprises a substrate 31, again a silicon wafer 32 provided with a silicon oxide layer 33 in this example. A surface 34 of the substrate is again provided with a thin-film structure comprising passive elements 35. The structure 35 comprises a resistor 36 formed in a layer of resistor material 37 and a capacitor 38 with a lower electrode 39 formed in an electrode layer 40 provided on the surface 34, with a dielectric 41 formed by a layer of insulating material 42 provided on the lower electrode 39, and with an upper electrode 43 formed in an electrode layer 44 provided on the dielectric 11. The thin-film structure 5 also comprises a coil 45 with turns 46 formed in the electrode layer 44 provided on the insulating 42. An end 48 of the coil 14 is connected to a further passive element (not shown) by means of a conductor track 47 formed in the electrode layer 40 present on the surface 4.

In this embodiment, the electrode layer 44 is constructed as a dual layer 49, 51. The dual layer 49, 51 is provided on the layer of insulating material 42 which forms the dielectric 41 of the capacitor 38. The electrode layer 40 constructed as a single layer of conductive material is provided on the surface 34 of the substrate 31.

In this example, the upper electrode 43 is formed in an electrode layer 44 constructed as a dual layer of which the layer of resistor material 37, in which also the resistor 36 is formed, constitutes a first partial layer 49, on which a layer of conductive material 40 is provided which constitutes the other, second partial layer 51. The capacitor 38 again shows a comparatively low series resistance, formed by the parallel arrangement of a series resistance situated in the partial layer 49 of resistor material and a series resistance situated in the partial layer 51 of conductive material.

The component shown in FIG. 10 may also be readily manufactured. First a layer of conductive material 40, in this example an approximately 500 nm thick layer of cobaltsilicide, is deposited on the surface 34 of the substrate 31 in a usual sputtering process.

After the layer 40 has been provided, the electrode 39 and the conductor track 47 are formed in the layer 40 in usual manner by means of a first photoresist mask 52.

Subsequently, the layer of insulating material 42 is provided. In this example this is an approximately 100 nm thick silicon nitride layer which is deposited by means of an LPCVD (Low Pressure Chemical Vapour Deposition) process. A denser silicon nitride layer can be obtained with an LPCVD process than with the PECVD process mentioned with reference to the first example. The LPCVD process, however, requires a higher process temperature, which renders it necessary to provide a layer of conductive material capable of withstanding such a high temperature below the deposited layer. Cobaltsilicide is a satisfactory material for this purpose, although also refractory metals such as tungsten and molybdenum would be suitable.

Contact windows 54 are provided in the layer of insulating material 42 by means of a second photoresist mask 53, after which the dual layer 49, 51 is deposited. A layer of resistor material 37 and a layer of conductive material 55 are deposited in a usual sputtering process without the substrate 31 being taken from the sputtering machine. The layer of resistor material 37 in this example is an approximately 100 nm thick TiW layer which has a square resistance of approximately 10Ω. The layer of conductive material 55 in this example is an approximately 500 nm thick aluminium layer.

After the dual layer 49, 51 has been provided, the upper electrode 43 of the capacitor 38 and the turns 46 of the coil 45 are etched in usual manner by means of a third photoresist mask 56. Finally, the partial layer 51 is removed from the resistor 36 by means of a fourth photoresist mask 57.

Not only the thin-film structure 35 with capacitor 38 and resistor 36, but also two wiring layers are formed with four photoresist masks also in this example.

In the embodiment shown in FIG. 10, the electrode layer 40 constructed as a single layer of conductive material is provided on the surface 34 of the substrate 31, and the electrode layer 49, 51 constructed as a dual layer is provided on the layer of insulating material 42 forming the dielectric 41 of the capacitor 38. The resistor 36 formed in the dual layer 49, 51 through local removal of the conductive layer 55 from this layer 49, 51 then lies exposed at the surface of the thin-film structure 35. The resistor 36 may thus be easily trimmed: the value of the resistor 36 may be readily changed through local removal of resistor material from the layer 37, for example, through heating with a laser beam.

The capacitance value of the capacitor 38 may also be easily changed because the upper electrode 43 lies exposed at the surface of the thin-film structure. The self-inductance value of the coil 45 may be easily changed in a corresponding manner because the turns 46 lies exposed at the surface of the thin-film structure 35.

Figure 11:
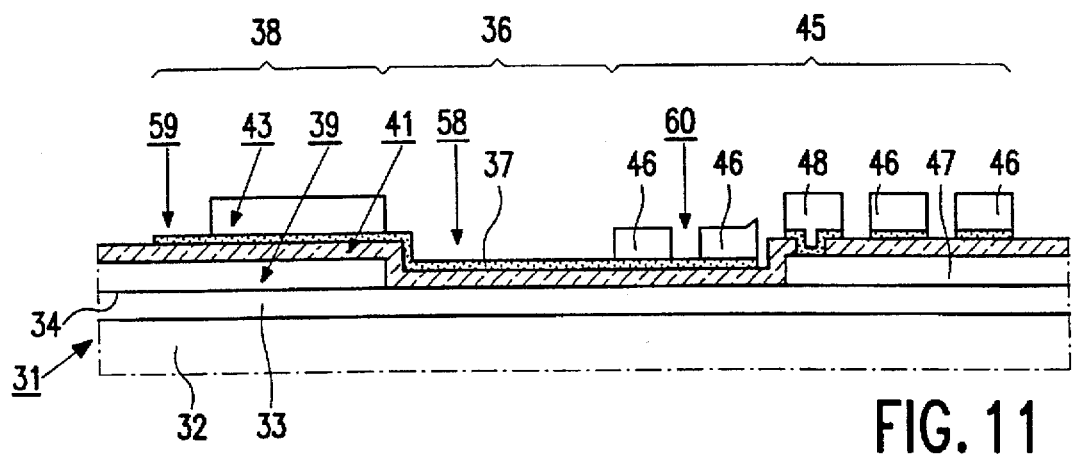
FIG. 11 diagrammatically and in cross-section shows a further preferred embodiment of an electronic component according to the invention.

Preferably, as shown in FIG. 11, a trimming surface 58 is formed in the resistor layer 37 at the area of the resistor 36, by means of which the value of the resistor 36 may be increased or reduced through removal of said trimming surface 58, and trimming surfaces 59 and 60 are formed in the dual layer at the areas of capacitor 38 and coil 45, by means of which the capacitance or self-inductance values may be increased or reduced through removal of said trimming surfaces 59 and 60. Such trimming surfaces 58, 59, 60 may be so provided that the resistance, capacitance, or self-inductance values may be increased or reduced to known, predetermined values. The trimming surface 58, for example, may be so provided at the area of the resistor 36 that a loop (not shown) formed in the layer of resistor material and forming part of the resistor 36 is short-circuited by the trimming surface 58. When the trimming surface 58 is subsequently removed, said loop is added to the resistor 36, so that the latter's resistance becomes greater. At the area of the capacitor 38, for example, the trimming surface 59 may form part of the upper electrode 43. When the trimming surface 59 is removed, the capacitor 38 is given a higher capacitance value. The trimming surface 60 at the area of the coil 45 may be so provided that a coil turn is short-circuited by this trimming surface 60. When the trimming surface 60 is removed, the coil 45 is given a higher self-inductance.

The layer of conductive material 55 has been removed from the layer of resistor material 37 at the areas of the trimming surfaces 59 and 60 for the capacitor 38 and the coil 45. For trimming of all passive elements mentioned, a trimming surface of a same material must then be removed, TiW in the example, for example through irradiation with a laser beam.

It will be obvious that the embodiments described above are merely examples and that many more variations are possible within the scope of the invention. Thus the substrate, which in the examples is a silicon wafer coated with a silicon oxide layer, may be manufactured from an alternative insulating material such as, for example, glass or aluminium oxide. With the use of a silicon wafer as the substrate, the component may comprise in addition to the passive elements also active elements such as transistors and diodes. An integrated circuit may even be provided in the substrate in that case. Such a circuit may possibly be provided, for example, on top of the thin-film structure comprising passive elements by means of a usual flip chip technique.

We claim:

1. An electronic component with a substrate of which a surface is provided with a thin-film structure with passive components, with a resistor formed in a layer of resistor material and a capacitor having a lower electrode formed in an electrode layer provided on the surface, a dielectric formed by a layer of insulating material provided on the lower electrode, and an upper electrode formed in an electrode layer provided on the dielectric, characterized in that one of the electrodes of the capacitor is formed in an electrode layer which is constructed as a dual layer of which a first partial layer is formed by the layer of resistor material in which the resistor is also formed, and a layer of conductive material is provided thereon which forms a second partial layer, in that the second partial layer contacts the first partial layer over the second partial layer's entire lateral extent, and in that the first partial layer extends beyond the lateral extent of the second partial layer to form said resistor.

2. An electronic component as claimed in claim 1, characterized in that the other electrode of the capacitor is formed in an electrode layer constructed as a single layer of conductive material.

3. An electronic component as claimed in claim 2, characterized in that conductor tracks are also formed in the electrode layers in which the electrodes of the capacitor are formed, wherein the tracks interconnect the passive elements in the component.

4. An electronic component as claimed in claim 1, characterized in that the electrode layer constructed as a single layer of conductive material is provided on the substrate surface, and the electrode layer constructed as a dual layer is provided on the layer of insulating material which forms the capacitor dielectric.

5. An electronic component as claimed in claim 4, characterized in that a coil is also formed in the electrode layer constructed as a dual layer, one coil end being connected to a conductor track formed in the electrode layer provided on the surface.

6. An electronic component as claimed in claim 5, characterized in that a trimming surface is formed in the dual layer at the area of the coil, by means of which the self-inductance value of the coil is changed through removal of said trimming surface.

7. An electronic component as claimed in claim 6, characterized in that the layer of conductived material is removed from the layer of resistor material at the areas of the trimming surfaces for the capacitor and the coil.

8. An electronic component as claimed in claim 4, characterized in that a trimming surface is formed in the resistor layer at the area of the resistor, by means of which the resistance value is changed through removal of said trimming surface.

9. An electronic component as claimed in claim 4, characterized in that a trimming surface is formed in the dual layer at the area of the capacitor, by means of which the capacitance value of the capacitor is changed through removal of said trimming surface.

10. An electronic component as claimed in claim 9, characterized in that the layer of conductive material is removed from the layer of resistor material at the area of the trimming surface for the capacitor.

* * * * *